United States Patent
Wu et al.

(10) Patent No.: US 12,129,418 B2
(45) Date of Patent: Oct. 29, 2024

(54) SELECTIVE ETCHANT COMPOSITIONS AND METHODS

(71) Applicant: ENTEGRIS, INC., Billerica, MA (US)

(72) Inventors: Hsing-Chen Wu, Hsinchu (TW);
Min-Chieh Yang, Hsinchu (TW);
Ming-Chi Liao, Billerica, MA (US);
Wen Hua Tai, Hsinchu (TW);
Wei-Ling Lan, Hsinchu (TW)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 17/743,080

(22) Filed: May 12, 2022

(65) Prior Publication Data

US 2022/0363990 A1 Nov. 17, 2022

Related U.S. Application Data

(60) Provisional application No. 63/187,606, filed on May 12, 2021.

(51) Int. Cl.
| | |
|---|---|
| *C09K 13/06* | (2006.01) |
| *C09K 13/00* | (2006.01) |
| *C09K 13/04* | (2006.01) |
| *H01L 21/02* | (2006.01) |
| *H01L 21/306* | (2006.01) |
| *H01L 21/311* | (2006.01) |
| *H01L 21/3213* | (2006.01) |

(52) U.S. Cl.
CPC .............. *C09K 13/06* (2013.01); *C09K 13/00* (2013.01); *C09K 13/04* (2013.01); *H01L 21/0217* (2013.01); *H01L 21/30604* (2013.01); *H01L 21/311* (2013.01); *H01L 21/31105* (2013.01); *H01L 21/32134* (2013.01)

(58) Field of Classification Search
None
See application file for complete search history.

(56) References Cited

U.S. PATENT DOCUMENTS

| | | | |
|---|---|---|---|
| 10,651,045 B2 | 5/2020 | Cooper et al. | |
| 11,053,440 B2 | 7/2021 | Bilodeau et al. | |
| 2016/0130500 A1 | 5/2016 | Chen | |
| 2018/0142151 A1 | 5/2018 | Lee | |
| 2019/0074188 A1* | 3/2019 | Cooper | H01L 21/67057 |
| 2019/0237338 A1 | 8/2019 | Rotondaro | |
| 2020/0157422 A1 | 5/2020 | Liu | |
| 2021/0296136 A1 | 9/2021 | Bilodeau et al. | |

FOREIGN PATENT DOCUMENTS

| | | | | |
|---|---|---|---|---|
| EP | 0498458 | * | 12/1992 | ............... C07F 7/18 |
| TW | 201540875 A | | 11/2015 | |
| WO | 2013028802 A1 | | 2/2013 | |
| WO | WO2020185762 | * | 9/2020 | ............. C09K 13/06 |

\* cited by examiner

*Primary Examiner* — Jiong-Ping Lu

(57) ABSTRACT

The present invention relates to compositions and methods for selectively etching silicon nitride in the presence of silicon oxide, polysilicon and/or metal silicides at a high etch rate and with high selectivity. Additives are described that can be used at various dissolved silica loading windows to provide and maintain the high selective etch rate and selectivity.

15 Claims, No Drawings

SELECTIVE ETCHANT COMPOSITIONS AND METHODS

CROSS-REFERENCE TO RELATED APPLICATIONS

This application claims the benefit under 35 USC 119 of U.S. Provisional Patent Application No. 63/187,606 filed May 12, 2021, the disclosure of which is hereby incorporated herein by reference in its entirety.

FIELD OF THE INVENTION

The present invention relates to a composition and method for selectively etching silicon nitride in the presence of silicon oxide, polysilicon and/or metal silicides, and more particularly to a composition and method for effectively and efficiently etching a layer of silicon nitride at a high etch rate and with high selectivity with respect to exposed or underlying layers of silicon oxide, polysilicon and/or metal silicides.

BACKGROUND OF THE INVENTION

In the microelectronics industry, ongoing demand exists for improved device performance and for decreased device sizes and decreased device feature sizes. Reduced feature sizes provide dual advantages of increasing device feature density and increasing device speed.

Reducing feature and device sizes requires finding new ways to improve steps of the multi-step process of manufacturing microelectronic devices. In methods for preparing many types of microelectronic devices, a step of removing silicon nitride is common. For example, a thin layer of silicon nitride ($Si_3N_4$), usually deposited by chemical vapor deposition from silane ($SiH_4$) and ammonia ($NH_3$), can be useful in a microelectronic device as a barrier for water and sodium. Also, patterned silicon nitride layers are used as a mask for spatially selective silicon oxide growth. Furthermore, methods have been explored to improve resolution and feature size in MOSFET devices by formation of a self-aligned polysilicon (poly-Si) gate structure. Using this method, contact points are formed for the source and the drain of the gate electrode, which are often covered by silicon nitride, that self-align with the poly-Si gate.

However, after being applied, removal of all or a portion of the silicon nitride materials may be required, which is commonly performed by etching. The removal of silicon nitride by etching must be performed in a manner that does not damage or disrupt other exposed or covered features of a microelectronic device. Specifically, the process for removing silicon nitride must preferentially not remove other materials that are also present at a surface of a microelectronic device substrate, such as silicon oxide.

According to various commercial methods, silicon nitride can be removed from a microelectronic device surface by a wet etching process that involves exposing the substrate surface to concentrated phosphoric acid ($H_3PO_4$) at an elevated temperature, e.g., in a bath having a temperature in a range from 150° C. to 180° C. For example, conventional wet etching techniques for selectively removing silicon nitride relative to silicon oxide have used aqueous phosphoric acid ($H_3PO_4$) solutions, typically about 85 weight percent phosphoric acid and 15 weight percent water. Using fresh hot phosphoric acid, a typical $Si_3N_4:SiO_2$ selectivity can be about 40:1.

Advantageously, as the nitride layer is removed, hydrated silicon oxide forms, which inhibits the additional removal of silicon oxide from the device surface. Thus, selectivity gradually increases with use. However, process control is often an issue due to the difficulties associated with maintaining a specific amount of water in the process solution. As a result, the amount of dissolved silica can change during the process, which can lead to complications arising from silica precipitation. For example, 3D-NAND structures typically require high-selectivity etching of silicon nitride (SiN) out of high aspect ratio "slits" defined by oxide (PETEOS). During a hot phosphoric acid etching process, oxide soon starts depositing near the slits' openings. This deposition of colloidal silica tends to "pinch off" the gaps or trenches in the microelectronic device.

As a result, oxide re-deposition rate from a phosphoric acid-based etching composition needs to be minimized. Therefore, there is a continuing need for compositions and methods having targeted amounts of dissolved silicate (also sometimes referred to as a "silicon loading window") that are stable during the selective removal of silicon nitride.

SUMMARY OF THE INVENTION

The present invention generally relates to an etchant composition for selectively removing silicon nitride relative to silicon oxide from the surface of a microelectronic device. The etchant composition comprises phosphoric acid, water, a dissolved silica, and at least one additive. In one embodiment, the additive is an alkylamine additive selected from the group consisting of diethylethylenediamine (DEEDA), tetramethyl ethylenediamine (TMEDA), tetraethyl ethylenediamine (TEEDA), tri(aminoethyl)amine (TAEA), polyethyleneimine (PEI), 1,4-diazabicyclo[2.2.2]octane (DABCO), N-ethylethylenediamine, 3-amino-5-methylpyrazole, creatinine, N,N'-dimethylpiperazine, hydroxylamine sulfate, dodecyltrimethylammonium chloride (DTAC), phosphate salts thereof, or combinations thereof; or the additive is a silane additive selected from the group consisting of N-trimethoxysilylpropyl-N,N,N-trimethylammonium halide, 3-aminopropylmethyl diethoxysilane, N-(3-triethoxysilylpropyl)-4,5-dihydroimidazole, N-(6-aminohexyl)aminomethyl triethoxysilane, N-(2-aminoethyl)-3-aminoisobutylmethyl dimethoxysilane, N-(2-aminoethyl)-3-aminopropylmethyl dimethoxysilane, (N,N-diethylaminomethyl)triethoxysilane, N-methylaminopropyl trimethoxysilane, 3-(trihydroxysilyl)propyl methylphosphonate, 3-(trihydroxysilyl)-1-propanesulfonic acid, carboxyethylsilanetriol, (2-diethylphosphatoethyl)triethoxysilane, aminoethylaminopropylsilsesquioxane, salts thereof, or combinations thereof. In another embodiment, the etchant composition comprises 400 ppm or more of the dissolved silica and the additive is an alkylamine additive selected from diethylethylenediamine (DEEDA), tetramethyl ethylenediamine (TMEDA), tetraethyl ethylenediamine (TEEDA), tri(aminoethyl)amine (TAEA), polyethyleneimine (PEI), ethylamine, diethylamine, tri-propylamine, tributylamine, 1,4-diazabicyclo[2.2.2]octane (DABCO), N-ethylethylenediamine, 3-amino-5-methylpyrazole, creatinine, N,N'-dimethylpiperazine, hydroxylamine sulfate, dodecyltrimethylammonium chloride (DTAC), phosphate salts thereof, or combinations thereof; or the etchant composition comprises 400 ppm or less of the dissolved silica and the additive is a silane additive selected from N-trimethoxysilylpropyl-N,N,N-trimethylammonium halide, 3-aminopropylmethyl diethoxysilane, N-(3-triethoxysilylpropyl)-4,5-dihydroimidazole, N-(6-aminohexyl)aminomethyl triethoxysilane, N-(2-aminoethyl)-3-aminoisobutylmethyl dimethoxysilane, N-(2-aminoethyl)-3-aminopropylmethyl dimethoxysilane, (N,N-diethylaminomethyl)triethoxysilane, N-methylaminopropyl trimethoxysilane, 3-(trihydroxysilyl)propyl methylphosphonate, 3-(trihydroxysilyl)-1-propanesulfonic acid, carboxyethylsilanetriol, (2-diethylphosphatoethyl)triethoxysilane, aminoethylaminopropylsilsesquioxane, salts thereof, or combinations thereof.

The present invention further relates to a method of selectively etching silicon nitride relative to silicon oxide from the surface of a substrate. The method comprises providing an etchant composition comprising phosphoric acid, water, a dissolved silica, and at least one additive; providing a substrate having a surface that includes silicon nitride and silicon oxide; and contacting the substrate with the etchant composition at conditions to selectively remove the silicon nitride relative to the silicon oxide. In one embodiment, the additive of the etchant composition is an alkylamine additive selected from diethylethylenediamine (DEEDA), tetramethyl ethylenediamine (TMEDA), tetraethyl ethylenediamine (TEEDA), tri(aminoethyl)amine (TAEA), polyethyleneimine (PEI), 1,4-diazabicyclo[2.2.2]octane (DABCO), N-ethylethylenediamine, 3-amino-5-methylpyrazole, creatinine, N,N'-dimethylpiperazine, hydroxylamine sulfate, dodecyltrimethylammonium chloride (DTAC), phosphate salts thereof, or combinations thereof; or the additive is a silane additive selected from N-trimethoxysilylpropyl-N,N,N-trimethylammonium halide, 3-aminopropylmethyl diethoxysilane, N-(3-triethoxysilylpropyl)-4,5-dihydroimidazole, N-(6-aminohexyl)aminomethyl triethoxysilane, N-(2-aminoethyl)-3-aminoisobutylmethyl dimethoxysilane, N-(2-aminoethyl)-3-aminopropylmethyl dimethoxysilane, (N,N-diethylaminomethyl)triethoxysilane, N-methylaminopropyl trimethoxysilane, 3-(trihydroxysilyl)propyl methylphosphonate, 3-(trihydroxysilyl)-1-propanesulfonic acid, carboxyethylsilanetriol, (2-diethylphosphatoethyl)triethoxysilane, aminoethylaminopropylsilsesquioxane, salts thereof, or combinations thereof. In another embodiment, the etchant composition comprises 400 ppm or more of the dissolved silica and the additive is an alkylamine additive selected from diethylethylenediamine (DEEDA), tetramethyl ethylenediamine (TMEDA), tetraethyl ethylenediamine (TEEDA), tri(aminoethyl)amine (TAEA), polyethyleneimine (PEI), ethylamine, diethylamine, tri-propylamine, tri-butylamine, 1,4-diazabicyclo[2.2.2]octane (DABCO), N-ethylethylenediamine, 3-amino-5-methylpyrazole, creatinine, N,N'-dimethylpiperazine, hydroxylamine sulfate, dodecyltrimethylammonium chloride (DTAC), phosphate salts thereof, or combinations thereof; or the etchant composition comprises 400 ppm or less of the dissolved silica and the additive is a silane additive selected from N-trimethoxysilylpropyl-N,N,N-trimethylammonium halide, 3-aminopropylmethyl diethoxysilane, N-(3-triethoxysilylpropyl)-4,5-dihydroimidazole, N-(6-aminohexyl)aminomethyl triethoxysilane, N-(2-aminoethyl)-3-aminoisobutylmethyl dimethoxysilane, N-(2-aminoethyl)-3-aminopropylmethyl dimethoxysilane, (N,N-diethylaminomethyl)triethoxysilane, N-methylaminopropyl trimethoxysilane, 3-(trihydroxysilyl)propyl methylphosphonate, 3-(trihydroxysilyl)-1-propanesulfonic acid, carboxyethylsilanetriol, (2-diethylphosphatoethyl)triethoxysilane, aminoethylaminopropylsilsesquioxane, salts thereof, or combinations thereof.

Other embodiments, features and advantages will be more fully apparent from the ensuing disclosure and appended claims. It has been found that such etchant compositions and methods can achieve removal of silicon nitride relative to silicon oxide with high etch selectivity, particularly while also providing targeted levels of dissolved silica.

DETAILED DESCRIPTION OF THE INVENTION

The present invention relates to a composition and method for selectively etching silicon nitride in the presence of silicon oxide. The composition and method effectively and efficiently remove silicon nitride from the surface of a microelectronic device at a high etch rate and with high selectivity with respect to layers of silicon oxide, polysilicon and/or metal silicides.

As used herein, the term "microelectronic device" (or "microelectronic device substrate," or simply "substrate") is used in a manner that is consistent with the generally understood meaning of this term in the electronics, microelectronics, and semiconductor fabrication arts, for example to refer to any of a variety of different types of: semiconductor substrates; integrated circuits; solid state memory devices; hard memory disks; read, write, and read-write heads and mechanical or electronic components thereof; flat panel displays; phase change memory devices; solar panels and other products that include one or more solar cell devices; photovoltaics; and microelectromechanical systems (MEMS) manufactured for use in microelectronic, integrated circuit, energy collection, or computer chip applications. It is to be understood that the term "microelectronic device" can refer to any in-process microelectronic device or microelectronic device substrate that contains or is being prepared to contain functional electronic (electrical-current-carrying) structures, functional semiconductor structures, and insulating structures, for eventual electronic used in a microelectronic device or microelectronic assembly.

As used herein, the term "silicon nitride" is given a meaning that is consistent with the meaning of the term as used in the microelectronics and semiconductor fabrication industries. Consistent therewith, silicon nitride refers to materials including thin films made of amorphous silicon nitride, e.g., deposited by chemical vapor deposition from silane and ammonia, with commercially useful low levels of other materials or impurities. The silicon nitride may be present as part of a microelectronic device substrate as a functioning feature of the device, for example as a barrier layer or an insulating layer, or may be present to function as a material that facilitates a multi-step fabrication method for preparing a microelectronic device.

As used herein, the term "silicon oxide" is given a meaning that is consistent with the meaning of the term as used in the microelectronics and semiconductor fabrication industries. Consistent therewith, silicon oxide refers to thin films made of silicon oxide ($SiO_x$), e.g., $SiO_2$, "thermal oxide" (ThOx), PETEOS, and the like. The silicon oxide can be placed on the substrate by any method, such as by being deposited by chemical vapor deposition from TEOS or another source, or by being thermally deposited. The silicon oxide can preferably contain a commercially useful low level of other materials or impurities. The silicon oxide may be present as part of a microelectronic device substrate as a feature of the microelectronic device, for example as an insulating layer.

Conventional wet etching techniques for selectively removing silicon nitride use hot (approximately 145-180° C.) aqueous phosphoric acid ($H_3PO_4$) solutions, which are typically 85% phosphoric acid and 15% water (by volume).

Fresh hot phosphoric acid can provide a typical silicon nitride:SiO$_2$ selectivity of about 40:1. Advantageously, as the nitride layer is removed, hydrated silicon oxide forms, which, consistent with Le Chatelier's principle, inhibits the additional removal of silicon oxide from the device surface. As a result, selectivity gradually increases with use.

However, process control issues can often arise due to the difficultly associated with maintaining a specific amount of water in the etchant solution. As a result, the dissolved silicon oxide may begin precipitating from the solution. For some applications, such as 3D-NAND, which require high-selectivity etching of silicon nitride out of high aspect ratio "slits" defined by oxide (PETEOS), deposition of silicon oxide near the slits' openings tends to "pinch off" the gaps or trenches in the microelectronic device, eventually blocking them. As a result, the process window of pre-etch oxide concentration (sometimes referred to as the "silicon loading window") can be very narrow and difficult to control, requiring the etchant bath to be replaced very often. Oxide re-deposition rate thus needs to be minimized to maintain a targeted silicon loading window.

The etchant compositions of the present disclosure include specific additives that surprisingly have been found to be capable of maintaining a targeted amount of dissolved silica at desired ranges in the composition. The additives are various alkylamine additives and various silane additives. By including these additives in an aqueous phosphoric acid composition, the amount of redeposition of the dissolved silica during use can be minimized while maintaining high etch selectivity.

In all such compositions, wherein specific components of the composition are discussed in reference to weight percentage ranges, it will be understood that such components may be present at concentrations as low as 0.001 weight percent, based on the total weight of the composition in which such components are employed. As used herein, "about" is intended to correspond to +/−5% of the stated value.

As used herein, the singular forms "a," "an" and "the" include their plural referents unless the context clearly dictates otherwise. The terms "containing" or "including" are intended to be synonymous with the term "comprising", meaning that at least the named compound, element, particle, or method step, etc., is present in the composition or article or method, but does not exclude the presence of other compounds, materials, particles, method steps, etc., even if the other such compounds, material, particles, method steps, etc., have the same function as what is named, unless expressly excluded in the claims.

The compositions comprise, consist of, or consist essentially of the components described herein. As a general convention throughout the present description, the etchant composition or a component thereof that is said to "consist essentially of" a group of specified ingredients or materials refers to a composition that contains the specified ingredients or materials with not more than a low or insignificant amount of other ingredients or materials, e.g., not more than 5, 2, 1, 0.5, 0.1, or 0.05 parts by weight of other ingredients or materials. For example, an etchant composition that consists essentially of phosphoric acid, water, dissolved silica, at least one additive selected from an amine additive or a silane additive, and optional additional components as described, means a composition that contains each of these components and not more than 5, 2, 1, 0.5, 0.1, or 0.05 weight percent of any other dissolved or un-dissolved material or materials (individually or as a total) other than the identified materials.

The etchant composition is an aqueous phosphoric acid composition that comprises phosphoric acid dissolved in water in an amount that is effective to produce desired etching of silicon nitride. Phosphoric acid is typically available as a concentrate in water. As such, the term "phosphoric acid" as used herein refers to the non-aqueous component of an aqueous phosphoric acid solution that is a component of the etchant composition while the terms "aqueous phosphoric acid" or "concentrated phosphoric acid" refers to the ingredient that is mixed or combined with other ingredients to form the etchant composition or to the final composition itself. "Concentrated" phosphoric acid refers to an aqueous phosphoric acid solution having a high or maximum amount of phosphoric acid dissolved in a low or minimum amount of water and substantially no other ingredients (e.g., less than 0.5 or 0.1 weight percent of any non-water or non-phosphoric acid solids materials). Concentrated phosphoric acid can typically be considered to have at least about 80 or 85 weight percent phosphoric acid in about 15 or 20 weight percent water.

The amount of phosphoric acid contained in the etchant composition can be any amount that, in combination with the other components described herein, will provide desired etching performance, including desired silicon nitride etch rate and selectivity. Typically, this requires a relatively high amount of phosphoric acid. For example, the etching composition can contain an amount of phosphoric acid that is at least about 50 weight percent based on total weight of the composition. Preferably, the amount of phosphoric acid is at least about 70 weight percent, and more preferably, at least about 80 or 85 weight percent based on total weight of the etchant composition.

The etchant composition further comprises water, which may result from the addition of the components of the composition or may be provided as a separately added component. Preferably the amount of water is less than 50 weight percent based on the total weight of the composition. For example, to provide the desired amount of phosphoric acid, the etchant composition may be prepared using concentrated phosphoric acid (85 weight percent phosphoric acid in water), which may be further diluted with water before or after being combined with other components of the etchant composition. In one embodiment, the composition comprises concentrated phosphoric acid in an amount that is at least 60, e.g., at least 80 or at least 90, 93, 95, or at least 98 weight percent of the composition, based on total weight of the composition. In a particularly preferred embodiment, the etchant composition comprises concentrated phosphoric acid with less than 5 weight percent added water based on the total weight of the composition, including no added water.

The etchant composition further comprises an amount of silica dissolved in the phosphoric acid and water, such as by dissolving solid silica material in the phosphoric acid or by adding a soluble silicon-containing compound that can form dissolved silica by reaction with aqueous phosphoric acid. Examples of such compounds include TMAS (tetramethylammonium silicate), tetraacetoxysilane, or a tetraalkoxysilane such as tetramethoxysilane, tetraethoxysilane, or the like. The dissolved silica may be effective to improve selectivity of the etching composition toward silicon nitride, and the amount may be any useful amount that does not lead to pre-processing silica supersaturation at conditions of an etching process, such as from about 5 to 50,000 parts per million dissolved silica or soluble silicon-containing compound based on total weight of the etching composition, or from about 20 to about 5,000, 3,000, 1,000, 700, 500, or 200 parts per million based on total weight of the etching composition.

The etchant composition further comprises at least one additive, which may be either an alkylamine additive or a silane additive. When the additive is an alkylamine additive, suitable alkylamines include, for example, diethylethylenediamine (DEEDA), tetramethyl ethylenediamine (TMEDA), tetraethyl ethylenediamine (TEEDA), tri(aminoethyl)amine (TAEA), polyethyleneimine (PEI), ethylamine, diethylamine, tri-propylamine, tri-butylamine, 1,4-diazabicyclo[2.2.2]octane (DABCO), N-ethylethylenediamine, 3-amino-5-methylpyrazole, creatinine, N,N'-dimethylpiperazine, hydroxylamine sulfate, dodecyltrimethylammonium chloride (DTAC), phosphate salts thereof, or combinations thereof. Preferably, the alkylamine additive is selected from diethylethylenediamine (DEEDA), tetramethyl ethylenediamine (TMEDA), tetraethyl ethylenediamine (TEEDA), tri(aminoethyl)amine (TAEA), polyethyleneimine (PEI), 1,4-diazabicyclo[2.2.2]octane (DABCO), N-ethylethylenediamine, 3-amino-5-methylpyrazole, creatinine, N,N'-dimethylpiperazine, hydroxylamine sulfate, dodecyltrimethylammonium chloride (DTAC), phosphate salts thereof, or combinations thereof.

In another embodiment, the additive is a silane additive. Suitable silanes include N-trimethoxysilylpropyl-N,N,N-trimethylammonium halide, 3-aminopropylmethyl diethoxysilane, N-(3-triethoxysilylpropyl)-4,5-dihydroimidazole, N-(6-aminohexyl)aminomethyl triethoxysilane, N-(2-aminoethyl)-3-aminoisobutylmethyl dimethoxysilane, N-(2-aminoethyl)-3-aminopropylmethyl dimethoxysilane, (N,N-diethylaminomethyl)triethoxysilane, N-methylaminopropyl trimethoxysilane, 3-(trihydroxysilyl)propyl methylphosphonate, 3-(trihydroxysilyl)-1-propanesulfonic acid, carboxyethylsilanetriol, (2-diethylphosphatoethyl)triethoxysilane, aminoethylaminopropylsilsesquioxane, salts thereof, or combinations thereof.

The choice of additive and the amount may be dependent, at least in part, on the desired level of dissolved silica to be maintained in the etchant composition. In general, the amount of additive is less than or equal to 5.0 weight percent based on the total weight of the composition. For example, the additive may be present in the composition in an amount of from about 10 ppm to about 5.0 weight %. Preferably the amount of additive is from 50 ppm to about 1.0 wt % and more preferably from about 100 ppm to about 2000 ppm. It has been found that the specific alkylamine additives can be used in these low amounts to provide a relatively high level of dissolved silica in the etchant composition. In addition, lower levels of dissolved silica may be provided and maintained with the specific silane additives at the low total amounts. In each case, high silicon nitride:$SiO_2$ etch selectivity and etch rates result.

For example, in one embodiment, the etchant composition comprises 400 ppm or more of dissolved silica, and, for this embodiment, the additive is preferably an alkylamine additive. Any of the alkylamines described above may be used. If higher levels of dissolved silica are desired, such as 500 ppm, 700 ppm, or more, preferably the alkylamine additive is selected from tetraethyl ethylenediamine (TEEDA), tri(aminoethyl)amine (TAEA), polyethyleneimine (PEI), ethylamine, diethylamine, 1,4-diazabicyclo[2.2.2]octane (DABCO), N-ethylethylenediamine, 3-amino-5-methylpyrazole, creatinine, N,N'-dimethylpiperazine, hydroxylamine sulfate, dodecyltrimethylammonium chloride (DTAC), phosphate salts thereof, or combinations thereof.

In another embodiment, the etchant composition comprises 400 ppm or less of dissolved silica and, for this embodiment, the composition comprises a silane additive. Any of the silane additives described above may be used depending on the targeted level of soluble silica. For example, the etchant composition may comprise 200 ppm or less of dissolved silica, and, for this lower level of dissolved silica, the silane additive is selected from N-trimethoxysilylpropyl-N,N,N-trimethylammonium halide, N-(2-aminoethyl)-3-aminopropylmethyl dimethoxysilane, (N,N-diethylaminomethyl)triethoxysilane, (2-diethylphosphatoethyl)triethoxysilane, aminoethylaminopropylsilsesquioxane, salts thereof, or combinations thereof.

While the etchant composition comprises phosphoric acid, water, dissolved silica, and at least one alkylamine or silane additive, the composition may also comprise various optional components. For example, the etchant composition may further comprise at least one additional silane additive and/or at least one additional alkylamine additive or phosphate salt thereof. These additional additives are different from those described above as the specific alkylamine additives or silane additives. In particular, examples of suitable additional silane additives include alkylaminoalkoxysilanes or alkylaminohydroxylsilanes, such as (3-aminopropyl)triethoxysilane, (3-aminopropyl) silanetriol, 3-aminopropyldimethylethoxysilane, 3-aminopropylmethyldiethoxysilane, N-(2-aminoethyl)-3-aminopropylmethyldimethoxysilane, (N,N-dimethyl-3-aminopropyl)trimethoxysilane, 3-aminopropyldimethylfluorosilane, N-(3-trimethoxysilylpropyl)diethylenetriamine, N-(2-aminoethyl)-3-aminopropyltriethoxysilane, N-(2-aminoethyl)-3-aminopropylsilanetriol, (3-trimethoxysilylpropyl)diethylenetriamine, and N-(6-aminohexyl)aminopropyltrimethoxysilane, 3,3'-(dimethoxysilylene)bis(1-propanamine), 2-[(dimethoxymethylsilyl)methyl]-1,4-butanediamine, 1,3-bis(3-aminopropyl)-1,1,3,3-tetraethoxydisiloxane, or 1,3-bis(3-aminopropyl)-1,1,3,3-tetramethoxydisiloxane.

The additional alkylamine additive or phosphate salt thereof may be a primary, secondary, or tertiary $C_1$-$C_6$ alkylamine or dihydrogen phosphate salt thereof. For example, the additional alkylamine additive can be an organic alkyl compound that includes an amine substituent (e.g., a primary amine), e.g., of a formula R—$NH_2$, wherein R is a straight or branched, preferably saturated, preferably un-substituted alkyl chain that contains from about 2 to about 15 carbon atoms, such as from about 4 to about 12 carbon atoms. Examples of suitable additional alkylamine additives include hexylamine, octylamine, 2-ethylhexylamine, dihexylamine, and decylamine. The alkylamine may be effective to provide improved etching rate or selectivity of silicon nitride, particularly when used in the presence of the specific alkylamine additives described above. The amount of the optional additional alkylamine additive in the etchant composition may be from about 5 to 10,000 parts per million, such as from about 20 to 1,000 parts per million, based on total weight of the etching composition.

The etchant composition may optionally further comprise at least one surfactant (different from the other optional or required ingredients of the present description) to improve performance of the etchant composition. As used herein, the term "surfactant" refers to an organic compound that lowers the surface tension (or interfacial tension) between two liquids or between a liquid and a solid, typically an organic amphiphilic compound that contains a hydrophobic group, such as a hydrocarbon (e.g., alkyl) "tail" and a hydrophilic group. Preferred surfactants are thermally stable and stay ionic under strongly acidic conditions such as the conditions of an etching process of the present invention. Examples include perfluoroalkylsulfonic acids and long-chain quaternary ammonium compounds (e.g. dodecyltrimethylammonium hydrogen sulfate). Fluorinated non-ionic surfactants such as Chemours' Capstone® FS-31/FS-35 can also be used. Non-ionic unfluorinated surfactants such as poly(ethylene glycol)-poly(propylene glycol) copolymers ("PEG-PPG") can also be used, and may be better suited for lower-temperature applications using lower concentrations of phosphoric acid (e.g. 100-130° C. and 50-75 weight percent $H_3PO_4$). The amount of surfactant in the etchant composition, when present, can be any amount that, in combination with the other components, will provide desired overall performance. For example, the etchant composition may comprise an amount of surfactant in a range from about 0.001 to about 10 weight percent, such as from about 0.01 to about 0.5, 1, 2, 7, or 7 weight percent based on total weight of the etchant composition.

Furthermore, the etchant composition may further optionally comprise at least one water-miscible organic solvent. The optional organic (non-aqueous) solvent can include any organic compound that is liquid at relevant operating temperature (e.g., a temperature of an etching bath), and is substantially miscible in, compatible with, and/or stable in the presence of the phosphoric acid of the etchant composition. Examples of suitable non-aqueous solvents include organic compounds such as ethers, polyols, alcohols, sulfones, and phosphate esters. Specific examples include sulfolane, tetraethylene glycol dimethyl ether (tetraglyme), diethylene glycol ethyl ether, dipropylene glycol methyl ether, and triethyl phosphate, any of which may be used alone or in combination with one or more other organic solvent. The amount of organic solvent, when present in the etchant composition, can be in an amount in a range from about 0.1 to about 25 weight percent, such as from about 0.5 to about 10, 15, or 20 weight percent water-miscible organic solvent, based on total weight of the etch composition.

The etchant compositions described herein have been found to be useful for selectively etching silicon nitride relative to silicon oxide from the surface of a microelectronic device substrate. As such, the present disclosure further relates methods, processes, and systems for using these etchant compositions for effectively and efficiently removing silicon nitride from the surface of a microelectronic device at an advantageously high etch rate of silicon nitride, an advantageously high selectivity of silicon nitride relative to silicon oxide, or an advantageous balance of these performance properties.

In the present method, an etchant composition as described herein is provided, comprising phosphoric acid, water, dissolved silica, and at least one alkylamine additive or at least one silane additive. The additives can be any of these described in more detail above. A microelectronic device substrate is also provided, having a surface that comprises silicon nitride and silicon oxide. The substrate is contacted with the etchant composition under conditions sufficient to selectively remove the silicon nitride relative to the silicon oxide. By this method, the silicon nitride material may be removed without substantially damaging metal and metal silicide interconnect materials. As such, the present method is a method for selectively and substantially removing silicon nitride materials relative to polysilicon and/or silicon oxide materials from the surface of the microelectronic device using the compositions described herein. The metal silicide materials that are present are not substantially corroded by the etchant compositions using this method.

In this method, the composition can be applied or contacted with the surface of the microelectronic device having the silicon nitride material thereon using any suitable method, including, for example, by spraying the etchant composition on the surface of the device, by dipping the device in a static or dynamic volume of the etchant composition, by contacting the device with another material, such as a pad or fibrous sorbent applicator element, that includes etchant composition thereon, by contacting the device including the silicon nitride material with a circulating etchant composition, or by any other suitable means by which the etchant composition and the surface of the microelectronic device can be brought into removal contact. The application may be in a batch or single wafer apparatus, for dynamic or static cleaning. In one embodiment, the application of the etchant composition to the surface of the microelectronic device is controlled by agitation whereby the composition is circulated through the container housing the composition.

The etchant composition and the microelectronic device substrate can be in contact for a time and a temperature sufficient for etchant removal of the silicon nitride. For example, contact may be for a sufficient time of from about 1 minute to about 200 minutes, in one embodiment, including about 15 minutes to about 100 minutes or about 1 minute to about 3 minutes for a single wafer tool. Furthermore, contact at sufficient conditions may include, but not limited to, in one embodiment, a temperature in a range of from about 120° C. to about 200° C., including from about 150° C. to about 200° C. or from about 160° C. to about 200° C. Such contacting times and temperatures are illustrative, and any other suitable time and temperature conditions may be employed that are efficacious to at least partially remove the silicon nitride material from the device structure. As such, the method achieves at least partial removal of the silicon nitride material in a highly efficient and highly selective manner due to the use of the selectivity of the etchant composition for silicon nitride material relative to other materials that may be present on the microelectronic device structure and exposed to the composition, such as metallization, polysilicon, silicon oxide(s), etc.

After selective etching of the silicon nitride, the method may further comprise the removal of the composition from the microelectronic device to which it has previously been applied, such as by rinse, wash, or other removal step(s), as may be desired in a given end use application. For example, the treated microelectronic device may be rinsed with a rinse solution including deionized water and/or dried, such as by spin-drying, $N_2$, vapor-drying, etc.

As discussed above, the etchant compositions and methods described herein selectively etch silicon nitride material relative to poly-Si and silicon oxides from the surface of the microelectronic device without causing substantial corrosion of the metal and/or metal silicide interconnect material (s). For example, the selectivity of silicon nitride to silicon oxide(s) resulting from the use of the etchant compositions may be in a range of from about 10:1 to about 7000:1, including about 30:1 to about 3000:1 or about 100:1 to about 2000:1, particularly when etching occurs at temperatures of from about 40-100° C., such as 60-95° C. and 75-90° C. In fact, the selectivity may be formally negative for some usable formulations, reflecting the fact that the thickness of the oxide film is very slightly but measurably increased by precipitation of silica. Advantageously, by use of the specific additives in combination with the targeted dissolved silica levels, the selectivity can be tunable within the recited ranges.

The method can be useful to etch silicon nitride material from a surface of any type of substrate. According to a particular embodiment, a substrate can include alternating thin film layers of silicon nitride as structural features of the substrate that includes alternating thin film layers of the silicon nitride layers with silicon oxide. The silicon oxide layers may be high aspect ratio structures that contain the silicon nitride layers disposed between the layers of silicon oxide.

The resulting selectively etched microelectronic device may be used in the manufacture of an article comprising the device. As such, the present disclosure further relates to a method of manufacturing an article comprising a microelectronic device, wherein the method comprises contacting the microelectronic device with an etchant composition as described herein under conditions, such as time and temperature, sufficient for selective etching of silicon nitride material from the surface of the microelectronic device relative to silicon oxide, and incorporating the etched microelectronic device into the article.

The etchant compositions described herein can be easily formulated by simple addition of the respective components and, if needed, mixing to form a homogeneous condition. The compositions may be readily formulated as single-package formulations or multi-part formulations that are mixed at the point of use and are preferably multi-part formulations. The individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

As such, the present disclosure further relates to a kit including, in one or more containers, one or more components adapted to form the etchant compositions described herein. In one embodiment, the kit includes, in one or more containers, the combination of at least one of phosphoric acid, water, dissolved silica, and at least one alkylamine additive and/or silane additive selected from the specified groups above for combining at the fab or the point of use. The containers of the kit must be suitable for storing and shipping of the composition components, for example, NOWPak®. containers (Advanced Technology Materials, Inc., Danbury, Conn., USA). The one or more containers preferably include means for bringing the components contained therein into fluid communication for blending and dispensing. For example, referring to the NOWPak®. containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended cleaning composition to a process tool.

Substantially chemically inert, impurity-free, flexible and resilient polymeric film materials, such as high-density polyethylene, may be used to fabricate the liners for one or more of the containers. Desirable liner materials are processed without requiring co-extrusion or barrier layers, and without any pigments, UV inhibitors, or processing agents that may adversely affect the purity requirements for components to be disposed in the liner. A listing of desirable liner materials includes films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Exemplary thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and U.S. Patent Application No. 60/916,966 entitled "SYSTEMS AND METHODS FOR MATERIAL BLENDING AND DISTRIBUTION" filed on May 9, 2007 in the name of John E. Q. Hughes, and PCT/US08/63276 entitled "SYSTEMS AND METHODS FOR MATERIAL BLENDING AND DISTRIBUTION" filed on May 9, 2008 in the name of Advanced Technology Materials, Inc.

This invention can be further illustrated by the following examples of certain embodiments thereof, although it will be understood that these examples are included merely for purposes of illustration and are not intended to limit the scope of the invention unless otherwise specifically indicated.

EXAMPLES

Example 1—Alkylamine Additives

Etchant compositions were prepared including various alkylamine additives. For each composition, a base composition was prepared by containing 89% concentrated phosphoric acid and water. To this was added the specified alkylamine additives in the amounts shown in Table 1 below. Trimethylammonium silicate (TMAS) was then added as a source of dissolved silica at 160° C. and 240 rpm mixing. The maximum amounts of dissolved silica obtained are shown below.

TABLE 1

| Alkylamine additive | Amount (ppm) | $SiO_2$ Loading Window (ppm) |
|---|---|---|
| DEEDA | 800 | 500 |
| TMEDA | 800 | 500 |
| TEEDA | 800 | 700 |
| TAEA | 800 | 700 |
| PEI | 800 | 600 |
| N3 + PEI | 600 + 600 | 1000 |
| TEEDA + TAEA | 700 + 700 | 1200 |
| TEEDA + TAEA + PEI | 600 + 600 + 600 | 1300 |
| Ethylamine | 800 | 800 |
| Diethylamine | 800 | 800 |
| Tripropylamine | 800 | <600 |
| Tributylamine | 800 | <600 |

As the data shows, the specific alkylamine additives provide high levels of dissolved silica (greater than 500 ppm, preferably greater than 700 ppm) in an aqueous phosphoric acid solution. It would be expected that each of these compositions would provide high selective etching of silicon nitride over silicon oxide as a result.

Example 2—Silane Additives

Etchant compositions were prepared including various silane additives. For each composition, a base composition was prepared by containing 89% concentrated phosphoric acid and water. To this was added the specified silane additives in the amounts shown in Table 2 below. TMAS was then added as a source of dissolved silica at 160° C. and 240 rpm mixing. The maximum amounts of dissolved silica obtained are shown below.

TABLE 2

| Silane additive | Amount (ppm) | SiO$_2$ Loading Window (ppm) | Silicon Oxide Etch Rate (Å/min) | Silicon Nitride Etch Rate (Å/min) |
|---|---|---|---|---|
| A | 800 | 200 | 0.7 | 36.6 |
| B | 800 |  | 1.0 | 37.4 |
| C | 800 |  | 0.5 | 35.8 |
| C | 900 |  | −0.1 | 29.6 |
| D | 800 | 300 | 0.4 | 37.7 |
| D | 900 |  | 0.6 | 31.1 |
| E | 800 |  | 1.0 | 39.8 |
| F | 800 | 200 | 1.0 | 37.5 |
| G | 800 | 200 | 0.6 | 37.6 |
| H | 800 | 400 | 0.5 | 36.5 |
| I | 800 |  | 0.6 | 36.7 |
| J | 800 | 400 | 0.2 | 35.5 |
| K | 800 | 200 |  |  |
| L | 800 | 200 | 0.4 | 37.5 |

A = N-trimethoxysilylpropyl-N,N,N-trimethylammonium chloride (CAS#: 35141-36-7)
B = 3-aminopropylmethyl diethoxysilane (CAS#: 3179-76-8)
C = N-(3-triethoxysilylpropyl)-4,5-dihydroimidazole (CAS#: 58068-97-6)
D = N-(6-aminohexyl)aminomethyl triethoxysilane (CAS#: 15129-36-9)
E = N-(2-aminoethyl)-3-aminoisobutylmethyl dimethoxysilane (CAS#: 23410-40-4)
F = N-(2-aminoethyl)-3-aminopropylmethyl dimethoxysilane (CAS#: 3069-29-2)
G = (N,N-diethylaminomethyl)triethoxysilane (CAS#: 15180-47-9)
H = N-methylaminopropyl trimethoxysilane (CAS#: 3069-25-8)
I = 3-(trihydroxysilyl)propyl methylphosphonate, monosodium salt (CAS#: 84962-98-1)
J = 3-(trihydroxysilyl)-1-propanesulfonic acid (CAS#: 70942-24-4)
K = (2-diethylphosphatoethyl)triethoxysilane (CAS#: 757-44-8)
L = aminoethylaminopropylsilsesquioxane As the data shows, the specific silane additives provide 400 ppm or lower, preferably 200 ppm or lower) dissolved silica in an aqueous phosphoric acid solution and also provide high selective etching of silicon nitride over silicon oxide.

Example 3—Alkylamine Additives

Etchant compositions were prepared including various alkylamine additives. For each composition, a base composition was prepared by containing 89% concentrated phosphoric acid and water. To this was added the specified alkylamine additives in the amounts shown in Table 3 below. Trimethylammonium silicate (TMAS) was then added as a source of dissolved silica at 160° C. and 240 rpm mixing.

The etchant compositions were applied to a device surface including a SiO$_2$ layer having a predetermined thickness, and the resulting SiO$_2$ thickness was measured. Based on the relative changes in thickness, the maximum amount of dissolved silica for the compositions that did not significantly increase the SiO$_2$ thickness (i.e., minimal to no redeposition of dissolved silica occurred) were determined and are shown in Table 3 below:

TABLE 3

| Alkylamine additive | Amount (ppm) | SiO$_2$ Loading Window (ppm) |
|---|---|---|
| DABCO | 800 | 800 |
| N-ethylethylenediamine | 800 | 800 |
| 3-amino-5-methylpyrazole | 800 | 800 |
| creatinine | 800 | 800 |
| N,N'-dimethylpiperazine | 800 | 800 |
| Hydroxylamine sulfate | 800 | 800 |
| DTAC | 800 | 700 |

As the data shows, the specific alkylamine additives provide high levels of dissolved silica (greater than 500 ppm, preferably greater than 700 ppm and as high as 800 ppm) in an aqueous phosphoric acid solution without significant redeposition of silica. It would be expected that each of these compositions would provide high selective etching of silicon nitride over silicon oxide as a result.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. An etchant composition consisting of:
   (a) phosphoric acid;
   (b) water;
   (c) dissolved silica;
   (d) at least one additive, wherein:
      i) the at least one additive is an alkylamine additive selected from diethylethylenediamine (DEEDA), tetramethyl ethylenediamine (TMEDA), tetraethyl ethylenediamine (TEEDA), tri(aminoethyl)amine (TAEA), polyethyleneimine (PEI), 1,4-diazabicyclo [2.2.2]octane (DABCO), N-ethylethylenediamine, 3-amino-5-methylpyrazole, creatinine, N,N'-dimethylpiperazine, hydroxylamine sulfate, dodecyltrimethylammonium chloride (DTAC), phosphate salts thereof, or combinations thereof; or
      ii) the at least one additive is a silane additive selected from N-trimethoxysilylpropyl-N,N,N-trimethylammonium halide, 3-aminopropylmethyl diethoxysilane, N-(3-triethoxysilylpropyl)-4,5-dihydroimidazole, N-(6-aminohexyl)aminomethyl triethoxysilane, N-(2-aminoethyl)-3-aminoisobutylmethyl dimethoxysilane, N-(2-aminoethyl)-3-aminopropylmethyl dimethoxysilane, (N,N-diethylaminomethyl)triethoxysilane, N-methylaminopropyl trimethoxysilane, 3-(trihydroxysilyl)propyl methylphosphonate, 3-(trihydroxysilyl)-1-propanesulfonic acid, carboxyethylsilanetriol, (2-diethylphosphatoethyl)triethoxysilane, aminoethylaminopropylsilsesquioxane, salts thereof, or combinations thereof;
   optionally (e) one or more surfactants;
   (f) at least one additional alkylamine or phosphate salt thereof in combination with the alkylamine additive; and
   optionally (g) one or more water miscible solvents, and wherein the etchant composition selectively etches silicon nitride relative to silicon oxide from the surface of a substrate.

2. The etchant composition of claim 1, wherein the at least one additive is present in an amount of from about 10 ppm to about 5.0% based on the total weight of the composition.

3. The etchant composition of claim 1, wherein the at least one additive is present in an amount of from about 100 ppm to about 2000 ppm based on the total weight of the composition.

4. The etchant composition of claim 1, wherein the dissolved silica is present in an amount of less than 50000 ppm based on the total weight of the composition.

5. The etchant composition of claim 1, wherein the phosphoric acid is present in an amount of from about 50 wt % to about 95 wt % based on the total weight of the composition.

6. The etchant composition of claim 1 comprising 50% or less water.

7. The etchant composition of claim 1, wherein the additional alkylamine or phosphate salt thereof is a primary, secondary, or tertiary $C_1$-$C_6$ alkylamine or dihydrogen phosphate salt thereof.

8. The etchant composition of claim 1 including at least one surfactant.

9. The etchant composition of claim 1 including at least one water-miscible solvent.

10. An etchant composition consisting of:
   (a) phosphoric acid;
   (b) water;
   (c) dissolved silica;
   (d) at least one additive, wherein:
      i) the etchant composition comprises 400 ppm or more of the dissolved silica and the at least one additive is an alkylamine additive selected from diethylethylenediamine (DEEDA), tetramethyl ethylenediamine (TMEDA), tetraethyl ethylenediamine (TEEDA), tri(aminoethyl)amine (TAEA), polyethyleneimine (PEI), ethylamine, diethylamine, tri-propylamine, tri-butylamine, 1,4-diazabicyclo[2.2.2]octane (DABCO), N-ethylethylenediamine, 3-amino-5-methylpyrazole, creatinine, N,N'-dimethylpiperazine, hydroxylamine sulfate, dodecyltrimethylammonium chloride (DTAC), phosphate salts thereof, or combinations thereof; or
      ii) the etchant composition comprises 400 ppm or less of the dissolved silica and the at least one additive is a silane additive selected from N-trimethoxysilylpropyl-N,N,N-trimethylammonium halide, 3-aminopropylmethyl diethoxysilane, N-(3-triethoxysilylpropyl)-4,5-dihydroimidazole, N-(6-aminohexyl) aminomethyl triethoxysilane, N-(2-aminoethyl)-3-aminoisobutylmethyl dimethoxysilane, N-(2-aminoethyl)-3-aminopropylmethyl dimethoxysilane, (N,N-diethylaminomethyl)triethoxysilane, N-methylaminopropyl trimethoxysilane, 3-(trihydroxysilyl) propyl methylphosphonate, 3-(trihydroxysilyl)-1-propanesulfonic acid, carboxyethylsilanetriol, (2-diethylphosphatoethyl)triethoxysilane, aminoethylaminopropylsilsesquioxane, salts thereof, or combinations thereof;
   optionally (e) one or more surfactants;
   optionally (f) at least one additional alkylamine or phosphate salt thereof in combination with the alkylamine additive; and
   optionally (g) one or more water miscible solvents, and wherein the etchant composition selectively etches silicon nitride relative to silicon oxide from the surface of a substrate, and wherein the etchant composition comprises 500 ppm or more of the dissolved silica and the at least one additive is an alkylamine additive selected from tetraethyl ethylenediamine (TEEDA), tri(aminoethyl)amine (TAEA), polyethyleneimine (PEI), ethylamine, diethylamine, 1,4-diazabicyclo [2.2.2]octane (DABCO), N-ethylethylenediamine, 3-amino-5-methylpyrazole, creatinine, N,N'-dimethylpiperazine, hydroxylamine sulfate, dodecyltrimethylammonium chloride (DTAC), phosphate salts thereof, or combinations thereof.

11. A method of selectively etching silicon nitride relative to silicon oxide from the surface of a substrate, the method comprising:
   1) Providing an etchant composition consisting of:
      (a) phosphoric acid;
      (b) water;
      (c) dissolved silica;
      (d) at least one additive, wherein:
         i) the at least one additive is an alkylamine additive selected from diethylethylenediamine (DEEDA), tetramethyl ethylenediamine (TMEDA), tetraethyl ethylenediamine (TEEDA), tri(aminoethyl) amine (TAEA), polyethyleneimine (PEI), 1,4-diazabicyclo[2.2.2]octane (DABCO), N-ethylethylenediamine, 3-amino-5-methylpyrazole, creatinine, N,N'-dimethylpiperazine, hydroxylamine sulfate, dodecyltrimethylammonium chloride (DTAC), phosphate salts thereof, or combinations thereof; or
         ii) the at least one additive is a silane additive selected from N-trimethoxysilylpropyl-N,N,N-trimethylammonium halide, 3-aminopropylmethyl diethoxysilane, N-(3-triethoxysilylpropyl)-4,5-dihydroimidazole, N-(6-aminohexyl) aminomethyl triethoxysilane, N-(2-aminoethyl)-3-aminoisobutylmethyl dimethoxysilane, N-(2-aminoethyl)-3-aminopropylmethyl dimethoxysilane, (N,N-diethylaminomethyl)triethoxysilane, N-methylaminopropyl trimethoxysilane, 3-(trihydroxysilyl)propyl methylphosphonate, 3-(trihydroxysilyl)-1-propanesulfonic acid, carboxyethylsilanetriol, (2-diethylphosphatoethyl)triethoxysilane, aminoethylaminopropylsilsesquioxane, salts thereof, or combinations thereof;
      optionally (e) one or more surfactants;
      (f) at least one additional alkylamine or phosphate salt thereof in combination with the alkylamine additive; and
      optionally (g) one or more water miscible solvents,
   2) providing a substrate having a surface that includes silicon nitride and silicon oxide, and
   3) contacting the substrate with the etchant composition at conditions to selectively remove the silicon nitride relative to the silicon oxide.

12. The method of claim 11, wherein contacting the substrate with the etchant composition removes the silicon nitride at an etch rate of greater than about 30 Å/min.

13. The method of claim 11, wherein contacting the substrate with the etchant composition selectively removes the silicon nitride relative to the silicon oxide with a selectivity ratio of greater than 35 Å/min.

14. The method of claim 11, wherein the substrate is contacted with the etchant composition at a temperature between 150° C. and 200° C.

15. A method of selectively etching silicon nitride relative to silicon oxide from the surface of a substrate, the method comprising:
1) providing an etchant composition consisting of:
   (a) phosphoric acid;
   (b) water;
   (c) dissolved silica;
   (d) at least one additive, wherein:
      i) the etchant composition comprises 400 ppm or more of the dissolved silica and the at least one additive is an alkylamine additive selected from diethylethylenediamine (DEEDA), tetramethyl ethylenediamine (TMEDA), tetraethyl ethylenediamine (TEEDA), tri(aminoethyl)amine (TAEA), polyethyleneimine (PEI), ethylamine, diethylamine, tri-propylamine, tri-butylamine, 1,4-diazabicyclo[2.2.2]octane (DABCO), N-ethylethylenediamine, 3-amino-5-methylpyrazole, creatinine, N,N'-dimethylpiperazine, hydroxylamine sulfate, dodecyltrimethylammonium chloride (DTAC), phosphate salts thereof, or combinations thereof; or
      ii) the etchant composition comprises 400 ppm or less of the dissolved silica and the at least one additive is a silane additive selected from N-trimethoxysilylpropyl-N,N,N-trimethylammonium halide, 3-aminopropylmethyl diethoxysilane, N-(3-triethoxysilylpropyl)-4,5-dihydroimidazole, N-(6-aminohexyl)aminomethyl triethoxysilane, N-(2-aminoethyl)-3-aminoisobutylmethyl dimethoxysilane, N-(2-aminoethyl)-3-aminopropylmethyl dimethoxysilane, (N,N-diethylaminomethyl)triethoxysilane, N-methylaminopropyl trimethoxysilane, 3-(trihydroxysilyl)propyl methylphosphonate, 3-(trihydroxysilyl)-1-propanesulfonic acid, carboxyethylsilanetriol, (2-diethylphosphatoethyl)triethoxysilane, aminoethylaminopropylsilsesquioxane, salts thereof, or combinations thereof;
   optionally (e) one or more surfactants;
   (f) at least one additional alkylamine or phosphate salt thereof in combination with the alkylamine additive; and
   optionally (g) one or more water miscible solvents,
1) providing a substrate having a surface that includes silicon nitride and silicon oxide, and
3) contacting the substrate with the etchant composition at conditions to selectively remove the silicon nitride relative to the silicon oxide.

* * * * *